(12) United States Patent
Yamasaki et al.

(10) Patent No.: US 6,966,936 B2
(45) Date of Patent: Nov. 22, 2005

(54) PROCESSING SYSTEM, EVACUATING SYSTEM FOR PROCESSING SYSTEM, LOW-PRESSURE CVD SYSTEM, AND EVACUATING SYSTEM AND TRAPPING DEVICE FOR LOW-PRESSURE CVD SYSTEM

(75) Inventors: Hideaki Yamasaki, Kofu (JP); Yumiko Kawano, Kofu (JP); Kenichi Kubo, Kofu (JP); Susumu Arima, Yamanashi-Ken (JP)

(73) Assignee: Tokyo Electron Limited, Tokyo-To (JP)

( * ) Notice: Subject to any disclaimer, the term of this patent is extended or adjusted under 35 U.S.C. 154(b) by 248 days.

(21) Appl. No.: 10/277,914

(22) Filed: Oct. 23, 2002

(65) Prior Publication Data

US 2003/0037730 A1    Feb. 27, 2003

Related U.S. Application Data

(62) Division of application No. 09/523,557, filed on Mar. 10, 2000, now abandoned.

(30) Foreign Application Priority Data

Mar. 11, 1999   (JP) ............................... 1999-64633

(51) Int. Cl.$^7$ ............................................. B01D 45/08
(52) U.S. Cl. ..................... 55/385.2; 55/434.2; 55/446; 55/DIG. 15; 96/228; 118/715
(58) Field of Search ........................... 55/434.2, 385.2, 55/446, DIG. 15; 96/231, 232, 228; 118/715; 156/345.29; 62/55.5

(56) References Cited

U.S. PATENT DOCUMENTS

| | | | |
|---|---|---|---|
| 4,193,777 A | | 3/1980 | de la Riviere |
| 4,372,759 A | | 2/1983 | Sederquist et al. |
| 4,940,213 A | * | 7/1990 | Ohmine et al. ............. 266/152 |
| 5,084,080 A | * | 1/1992 | Hirase et al. .............. 55/434.1 |
| 5,422,081 A | * | 6/1995 | Miyagi et al. .............. 422/170 |
| 5,599,382 A | | 2/1997 | Bielawski et al. |
| 5,788,747 A | * | 8/1998 | Horiuchi et al. ............. 95/288 |
| 5,819,683 A | * | 10/1998 | Ikeda et al. ................ 118/724 |
| 5,904,757 A | * | 5/1999 | Hayashi et al. .............. 96/416 |
| 5,928,426 A | * | 7/1999 | Aitchison .................. 118/715 |

(Continued)

Primary Examiner—Robert A. Hopkins
(74) Attorney, Agent, or Firm—Finnegan, Henderson, Farabow, Garrett & Dunner, L.L.P.

(57) ABSTRACT

An object of the present invention is to ensure the stable operation of a vacuum pump for discharging an unused source gas and reaction byproduct gases from a low-pressure processing chamber, to recover the reaction byproducts efficiently for the effective utilization of resources and reduction of running costs. A low-pressure CVD system has a processing vessel (10) for carrying out a low-pressure CVD process for forming a copper film, a source gas supply unit (12) for supplying an organic copper compound as a source gas, such as Cu(I)hfacTMVS, into the processing vessel (10), and an evacuating system (14) for evacuating the processing vessel (10). The evacuating system (14) includes a vacuum pump (26), a high-temperature trapping device (28) disposed above the vacuum pump (26) with respect to the flowing direction of a gas, and a low-temperature trapping device (30) disposed below the vacuum pump with respect to the flowing direction of a gas. The high-temperature trapping device (28) decomposes the unused Cu(I)hfacTMVS contained in a gas sucked out of the processing vessel (10) to trap metallic copper. The low-temperature trapping device traps $Cu(II)(hfac)_2$ produced as a reaction byproduct.

6 Claims, 10 Drawing Sheets

U.S. PATENT DOCUMENTS

| | | |
|---|---|---|
| 6,051,053 A * | 4/2000 | Noji et al. .................... 95/133 |
| 6,099,649 A | 8/2000 | Schmitt et al. |
| 6,156,107 A * | 12/2000 | Hayashi et al. ............... 96/416 |
| 6,402,806 B1 * | 6/2002 | Schmitt et al. ............... 75/414 |
| 6,554,879 B1 * | 4/2003 | Nomura .................... 55/385.1 |
| 2002/0100417 A1 * | 8/2002 | Suzuki et al. ............... 118/715 |

* cited by examiner

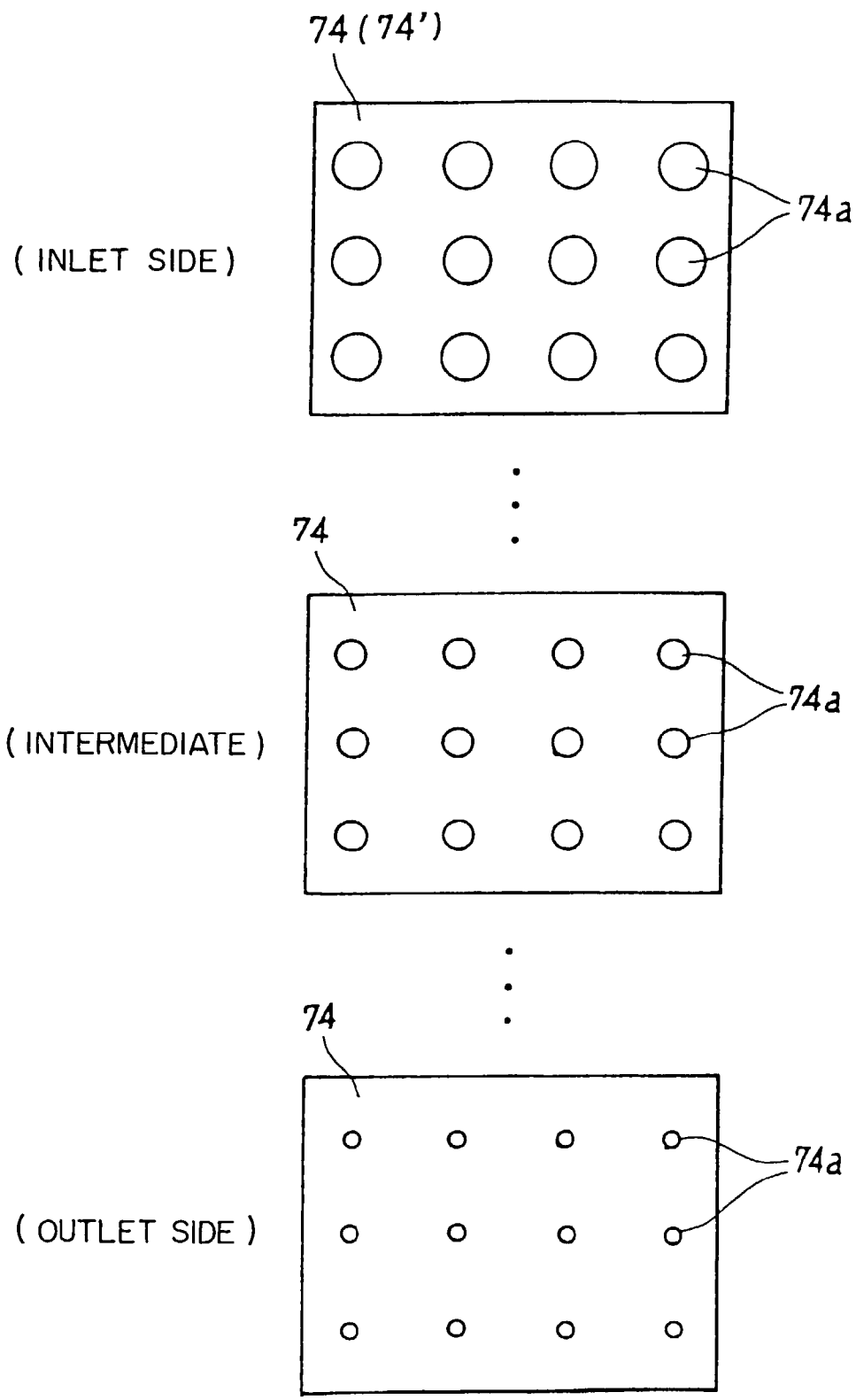
F I G. 6

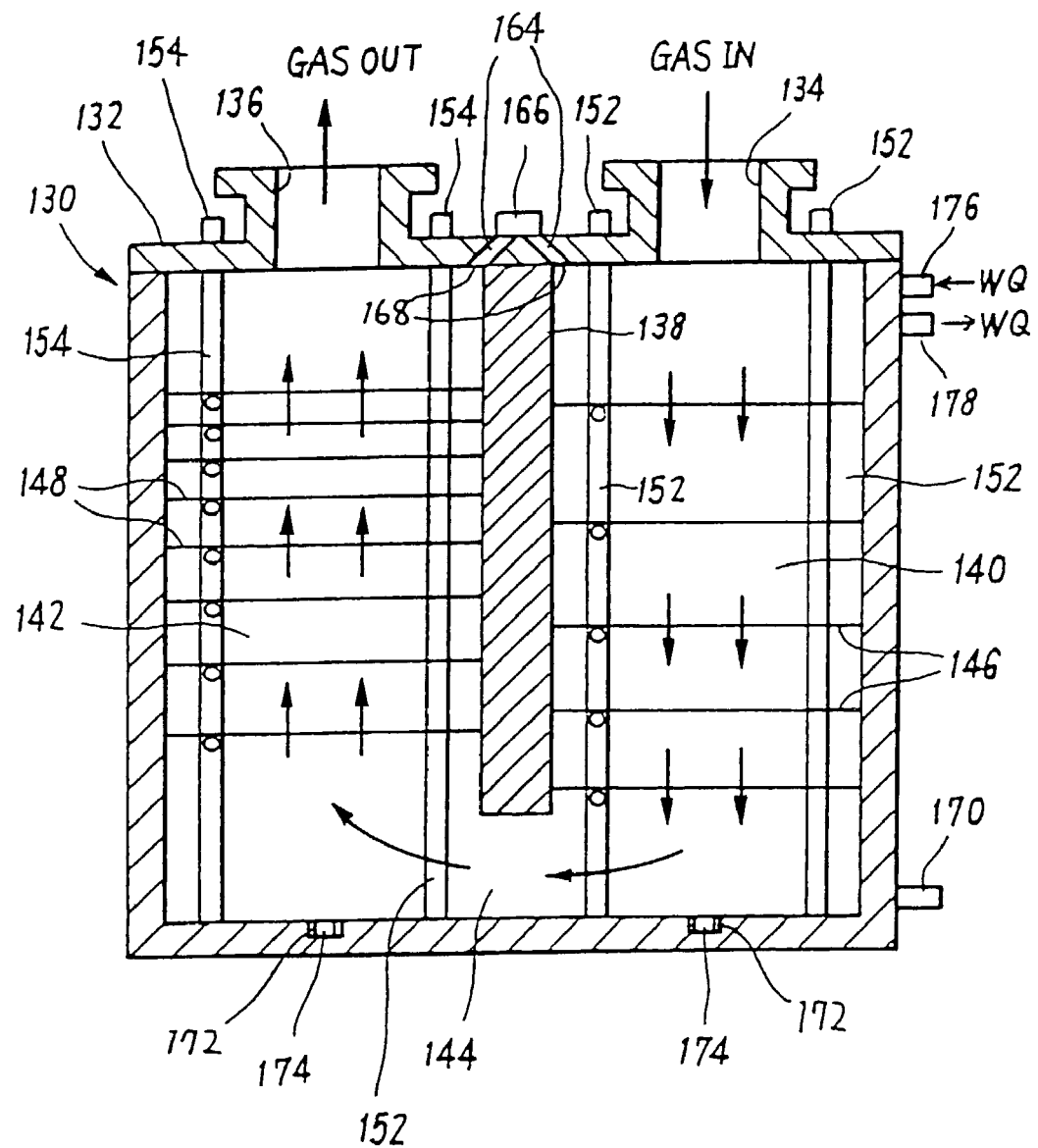
F I G. 10

PROCESSING SYSTEM, EVACUATING SYSTEM FOR PROCESSING SYSTEM, LOW-PRESSURE CVD SYSTEM, AND EVACUATING SYSTEM AND TRAPPING DEVICE FOR LOW-PRESSURE CVD SYSTEM

This is a division of application Ser. No. 09/523,557 filed Mar. 10, 2000 now abandoned, which is incorporated herein by reference.

BACKGROUND OF THE INVENTION

1. Field of the Invention

The present invention relates to a system that uses gases in a microprocess for fabricating semiconductor devices. More specifically, the present invention relates to a processing system of a chemical reaction type, typically, a low-pressure CVD system, and an evacuating system and a trapping device which can be used in combination with a processing system of this kind.

2. Description of the Related Art

Multilevel wiring structures have been used generally in recent years. The progressive increase in device density requires reduction in size of contact holes for connecting metal wiring lines in different wiring layers. Consequently, the aspect ratio (=(Depth of hole)/(Width of hole)) of contact holes increases accordingly. The enhancement of the operating speed of the individual component semiconductor elements and devices of chips requires the use of materials having low resistance for forming wiring layers and filling up contact holes.

To meet demand for miniaturization and resistance reduction, the use of copper as a material for forming metal wiring lines instead of aluminum which has been generally used for forming metal wiring lines and techniques for forming copper films by a CVD process (chemical vapor deposition process) have been studied.

Generally, organic copper compounds are used for forming a copper film by a CVD process. Cu(I)hfacTMVS is a notable material. In the term Cu(I)hfacTMVS, hfac is an abbreviation for hexafluoroacetylacetonate, the term TMVS is an abbreviation for trimethylvinyl silane, and Cu(I) indicates univalent copper. In the following description, the terms Cu(II) and Cu(0) indicate bivalent copper and metallic copper, respectively. Cu(I)hfacTMVS is a low-viscosity liquid at an ordinary temperature and has a moderate vapor pressure of 1 torr at 60° C. Therefore, Cu(I)hfacTMVS can be relatively easily gasified into a source gas by a system including a liquid supply system and a gasifier and the source gas can be supplied into a reaction chamber or a processing chamber. Since Cu(I)hfacTMVS is subject to decomposition at temperatures not lower than 70° C., a copper film can be formed on a substrate at a deposition rate that does not cause any problem in the process by using Cu(I)hfacTMVS.

Other possible organic copper compounds are β-diketonate compounds, such as Cu(II)(hfac)$_2$, and cyclopentadienyl compounds, such as CpCuTEP. However, since those copper compounds are solid at an ordinary temperature, those copper compounds are difficult to supply in gases into a processing chamber. A high temperature not lower then 380° C. is necessary for decomposing Cu(II)(hfac)$_2$. CpCuTEP has a very low vapor pressure of 0.01 torr at 80° C. and hence it is difficult to supply CpCuTEP at a sufficiently high partial pressure to the processing chamber when depositing a film.

Cu(I)hfacTMVS. as compared with other organic copper compounds, can be easily gasified and supplied into a processing chamber by using a system including a liquid supply system and a gasifier and a film can be deposited at a relatively low temperature by using Cu(I)hfacTMVS.

Generally, copper films are deposited by a low-pressure CVD process. A CVD processing chamber is evacuated to a predetermined pressure, and unused source gases and reaction byproduct gases are discharged from the processing chamber by a vacuum pump. Since it is possible that oil is diffused into the processing chamber when a wet vacuum pump, such as an oil-sealed rotary vacuum pump, is used, a dry vacuum pump free from such a problem is used in most cases.

The condensation temperature and the decomposition temperature of Cu(I)hfacTMVS gas are close to each other. This characteristic of Cu(I)hfacTMVS is a problem with the evacuating system for a low-pressure CVD process.

Unused Cu(I)hfacTMVS sucked from the processing chamber condenses in the vacuum pump if the temperature in the vacuum pump is low and will cause troubles in rotary components of the vacuum pump and, if things come to the worst, the rotary components may be damaged.

Generally, the interior of the vacuum pump is heated to avoid the condensation of Cu(I)hfacTMVS. It is hardly possible to maintain parts of a complex structure, such as the vacuum pump, uniformly at the same temperature, and the temperatures of different parts of the vacuum pump differ necessarily from each other. The decomposition of Cu(I)hfacTMVS around parts of relatively high temperatures proceeds and it is possible that copper deposits on those parts. If those parts are maintained at a lower temperature to avoid the deposition of copper, Cu(I)hfacTMVS condenses on those parts.

In the low-pressure CVD process using Cu(I)hfacTMVS as a source gas, it is very difficult to suppress the condensation and the decomposition of Cu(I)hfacTMVS simultaneously in the vacuum pump.

In this CVD process, Cu(I)hfacTMVS decomposes into Cu(0) and Cu(II)(hfac)$_2$. Although Cu(0) produced by reaction forms a copper film, the reaction byproduct, Cu(II)(hfac)$_2$ containing 50% of Cu atoms contained in the source gas is disposed of. Thus, the resource utilizing efficiency of the CVD process has been low.

SUMMARY OF THE INVENTION

The present invention has been made in view of the foregoing problems and it is therefore an object of the present invention to provide a processing system and an evacuating system capable of ensuring the stable operation of a vacuum pump for discharging unused source gases and reaction byproduct gases from a low-pressure processing chamber, and of efficiently recovering the reaction byproducts for the effective utilization of resources and reduction of running costs.

A second object of the present invention is to provide an evacuating system for a CVD system that carries out a low-pressure CVD process using Cu(I)hfacTMVS as a source gas, capable of efficiently and surely preventing the suction of unused Cu(I)hfacTMVS into a vacuum pump to ensure the safety of the vacuum pump and of efficiently recovering the reaction byproducts for the effective utilization of resources and reduction of running costs.

A third object of the present invention is to provide a trapping device capable of selectively and surely trapping unused source gas contained in a gas discharged from a processing chamber.

A fourth object of the present invention to provide a trapping device capable of efficiently recovering trapped organic compounds.

With the foregoing objects in view, the present invention provides a processing system comprises a processing vessel defining a low-pressure processing chamber in which a predetermined process for making a source gas undergo a reaction to produce a reaction product; a vacuum pump for sucking a gas containing the unused source gas and one or a plurality of reaction byproduct gases from the processing chamber to evacuate the processing chamber to a predetermined pressure; a first trapping device placed in a suction passage extending between the processing vessel and the vacuum pump to make substantially only and almost all the unused source gas sucked from the processing chamber undergo a reaction and to trap a reaction product; and a second trapping device placed in a discharge passage connected to the discharge side of the vacuum pump to condense a predetermined reaction byproduct gas discharged from the vacuum pump and to trap the reaction byproduct.

Typically, the processing system according to the present invention is a low-pressure CVD system for making a source gas containing an organic copper compound undergo a reaction to deposit a copper film, i.e., a reaction product, on a substrate.

According to the present invention, an evacuating system for a low-pressure CVD system comprises a dry pump for evacuating a processing vessel defining a low-pressure processing chamber in which Cu(I)hfacTMVS, i.e., a source gas, undergoes a chemical reaction expressed by:

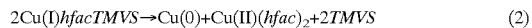

2Cu(I)*hfacTMVS*→Cu(0)+Cu(II)(*hfac*)$_2$+2*TMVS*  (2)

to deposit Cu(0) on a substrate to a predetermined pressure by sucking a gas containing the unused Cu(I)hfacTMVS and gas-phase Cu(II)(hfac)$_2$ as a reaction byproduct from the low-pressure processing chamber; a first trapping device placed in a suction passage extending between the processing vessel and the dry pump to make substantially only and almost all the unused Cu(I)hfacTMVS undergo a reaction to trap Cu(0) produced by the reaction; and a second trapping device placed in a discharge passage connected to the discharge side of the dry pump to trap Cu(II)(hfac)$_2$ by condensing the gas-phase CU(II)(hfac)$_2$.

In the evacuating system according to the present invention for a low-pressure CVD system, preferably, reaction temperature in the first trapping device is in the range of 180 to 300° C. to make substantially only and almost all the unused Cu(I)hfacTMVS undergo reaction.

Desirably, the first trapping device is provided with trapping members made of copper or plated with copper to decompose Cu(I)hfacTMVS rapidly and to deposit Cu(0) stably and surely.

A trapping device according to the present invention that can be disposed above a vacuum pump to heat a predetermined gas-phase substance for reaction and to trap a reaction product comprises a tubular housing having opposite open ends; a tubular trapping body provided with an gas inlet part and a gas outlet part formed respectively at opposite ends thereof, and inserted through either of the open ends of the housing in the housing so as to be detachably contained in the housing with the gas inlet part placed at one of the open ends of the housing and the gas outlet part placed at the other open end of the housing; trapping members placed in a gas passage between the gas inlet part and the gas outlet part of the trapping body so as to be in contact with the gas-phase substance introduced through the gas inlet part into the trapping body to make the reaction product deposit thereon; and a heating means for heating the trapping members at a predetermined temperature.

In this trapping device, the trapping body containing the trapping members on which the reaction byproduct is deposited can be detachably mounted on the housing. Preferably, the heating means is disposed in a space between the outer circumference of the trapping body and the inner circumference of the housing to heat the space surrounding the trapping body.

A trapping device according to the present invention that can be disposed below the vacuum pump to condense a predetermined organic gas and to trap a condensed organic compound comprises a housing having a gas inlet opening, a gas outlet opening and a gas passage extending between the gas inlet opening and the gas outlet opening; trapping members disposed in the housing so as to extend along the gas passage and having condensing surfaces to condense the organic gas introduced through the gas inlet opening into the housing thereon; a chemical liquid supply system for supplying a chemical liquid for dissolving the organic compound adhering to a part of the condensing surfaces of the trapping members or to the entire condensing surfaces of the same; and a chemical liquid recovering means for recovering the chemical liquid containing the organic compound dissolved therein.

In this trapping device, it is preferable, in view of efficiently dissolving the organic compound in the chemical liquid, that the trapping members include a plurality of trapping plates vertically arranged in a zigzag arrangement with the alternate inclined condensing surfaces thereof directed in opposite directions, respectively, and the chemical liquid supply system has a chemical liquid supply passage for delivering the chemical liquid onto the uppermost trapping plate so that the chemical liquid flows down successively along the trapping plates from the higher to the lower trapping plates. It is effective to vibrate the trapping members by an ultrasonic vibrator while the chemical liquid is supplied to the trapping plates.

The chemical liquid recovering means may be provided with a chemical liquid returning means for returning the recovered chemical liquid to the chemical liquid supply passage to enhance the efficiency of chemical liquid utilization.

In a modification, it is preferable that the trapping members include a plurality of trapping plates vertically arranged at predetermined intervals, the housing is provided therein with support members for detachably supporting the trapping plates in place, the housing has a trapping plate receiving part capable of receiving the trapping plates released from the support members and dropped down and of containing a liquid, the chemical liquid supply system has a chemical liquid passage for supplying the chemical liquid so that the chemical liquid flows along the inner surface of the housing into the trapping plate receiving part, and the trapping plates can be immersed in the chemical liquid contained in the trapping plate receiving part.

In this trapping device, the adhesion of the organic compound to the trapping plates and the dissolution of the organic compound adhering to the trapping plates occur successively. The trapping members need cooling when making the organic compound condense thereon and needs heating when dissolving the organic compound adhering there to. It is preferable, for the simple and efficient cooling and heating of the trapping members, that a heating/cooling passage is combined thermally with the trapping members, a cooling heat transfer medium is passed through the heating/cooling passage when making the organic compound condense on the trapping members, and a heating heat transfer medium is passed through the same when dissolving the organic compound adhering to the trapping members in the chemical liquid.

BRIEF DESCRIPTION OF THE DRAWINGS

FIG. 6 is a plan view of trapping plates included in the trapping device in the second embodiment;

FIG. 10 is a schematic longitudinal sectional view of a trapping device in a fourth embodiment according to the present invention;

DESCRIPTION OF THE PREFERRED EMBODIMENTS

Figure 1:
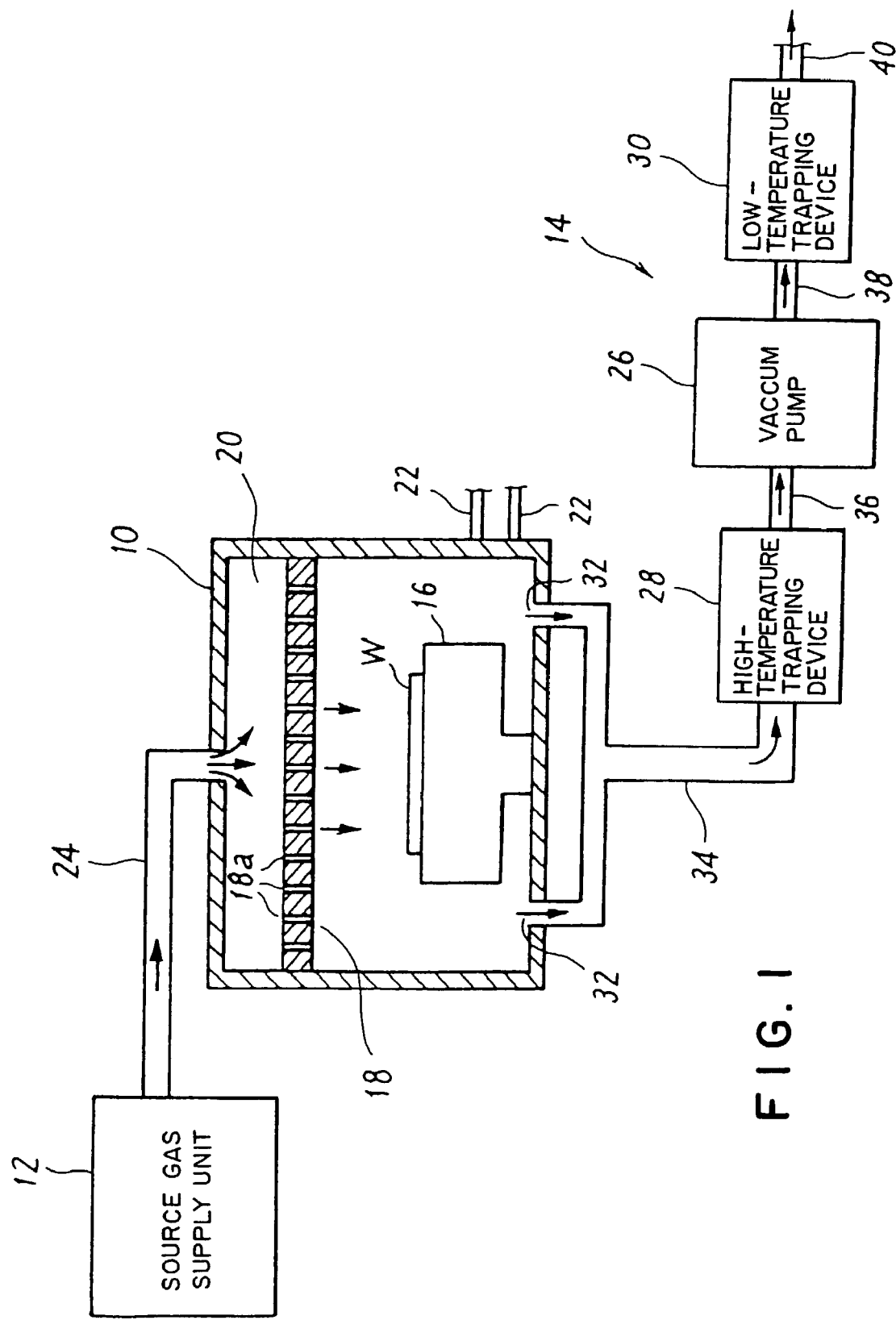
FIG. 1 is a typical view of a low-pressure CVD system in a preferred embodiment according to the present invention.

FIG. 1 shows typically a low-pressure CVD system in a preferred embodiment according to the present invention.

The low-pressure CVD system includes a processing vessel 10 in which a low-pressure CVD process is carried out to form a copper film, a source gas supply unit 12 for supplying an organic copper compound, such as Cu(I)hfacTMVS, as a source gas into the processing vessel 10, and an evacuating system 14 for evacuating the processing vessel 10.

The processing vessel 10 defines a vacuum chamber. A table 16 for holding a semiconductor wafer W thereon is disposed in a bottom, central part of the vacuum chamber. The table 16 is internally provided with a built-in heater having a resistance heating element to heat the semiconductor wafer W at a predetermined temperature during the low-temperature CVD process.

A perforated plate 18 provided with a plurality of gas supply holes 18a is disposed in an upper region of the processing chamber of the processing vessel 10 so as to define a buffer chamber 20 over the perforated plate 18. A passage, not shown, for passing a temperature regulating medium is formed within, on the outer surface or on the inner surface of a wall of the processing vessel 10. The temperature regulating medium, such as water, is circulated through the passage and pipes 22 by an external temperature regulating unit, not shown, to maintain the wall of the processing vessel 10 at a predetermined temperature.

The source gas supply unit 12 has a container for storing liquid-phase Cu(I)hfacTMVS, i.e., the source gas, and a gasifier for gasifying Cu(I)hfacTMVS in gas-phase Cu(I)hfacTMVS of a predetermined temperature, such as 60° C. having a predetermined pressure, such as 1 torr. Cu(I)hfacTMVS gas produced by gasifying the liquid-phase Cu(I)hfacTMVS is supplied together with a nonoxidative carrier gas, such as hydrogen, Ar or He, through a gas supply pipe 24 into the buffer chamber 20 of the processing vessel 10.

To suppress the unstable decomposition of Cu(I)hfacTMVS, a mixture of Cu(I)hfacTMVS and Hhfac and TMVS, such as "CupraSelect®" containing Cu(I)hfacTMVS, 0.4% Hhfac and 2.5% TMVS, may be used as a source gas.

The evacuating system includes a vacuum pump 26, a high-temperature trapping device 28 disposed above the vacuum pump 26, and a low-temperature trapping device 30 disposed below the vacuum pump 26. Discharge ports 32 formed in the bottom wall of the processing vessel 10 are connected to the inlet port of the high-temperature trapping device 28 by a discharge pipe 34. The outlet port of the high-temperature trapping device 28 is connected to the suction port of the vacuum pump by a discharge pipe 36. The discharge port of the vacuum pump 26 is connected to the gas inlet port of the low-temperature trapping device 30 by a discharge pipe 38. The discharge port of the low-temperature trapping device is connected to an exhaust duct, a decontaminating device or the like by a discharge pipe 40.

The vacuum pump 26 is of a dry type. The vacuum pump 26 evacuates the processing vessel 10 to a predetermined pressure and sucks unused source gas and reaction byproducts from the processing vessel 10. A plurality of mechanical booster pump may be disposed above the vacuum pump 26 to enhance evacuating ability.

The high-temperature trapping device 28 makes substantially only and almost all the unused Cu(I)hfacTMVS sucked from the processing vessel 10 undergo a chemical reaction and traps Cu(0) produced by the chemical reaction. Consequently, only gases, such as $Cu(II)(hfac)_2$ and Hhfac and TMVS separated from the Cu(I)hfacTMVS, are sucked by the vacuum pump 26, and substantially no Cu(I)hfacTMVS flows into the vacuum pump 26.

The low-temperature trapping device 30 condenses $Cu(II)(hfac)_2$ discharged from the vacuum pump 26 to trap the same. Thus, the $Cu(II)(hfac)_2$ containing 50% of Cu atoms contained in the source gas is recovered and recycled The operation of the low-pressure CVD system will be described.

A mixture of the source gas, i.e., Cu(I)hfacTMVS, and the carrier gas is supplied from the source gas supply unit 12 through the gas supply pipe 24 into the buffer chamber 20 of the processing vessel 10. The mixture of uniform Cu(I)hfacTMVS concentration is blown uniformly through the gas supply holes 18a of the perforated plate 18 to the semiconductor wafer W supported on the table 16.

During the low-pressure CVD process, the operation of the vacuum pump 26 so as to maintain the processing chamber of the processing vessel 10 at a predetermined pressure, such as 1 torr. The semiconductor wafer W supported on the table 16 is heated by the built-in heater of the table 16 at a predetermined reaction temperature, such as about 190° C. The Cu(I)hfacTMVS, i.e., the source gas, blown to the surface of the semiconductor wafer W undergoes the reaction (decomposition) expressed by Chemical formula (2) at the predetermined temperature and the predetermined pressure. Consequently, Cu(0) is produced and deposited on the surface of the semiconductor wafer W. The surfaces of the walls of the processing vessel 10 are maintained at a temperature effective in preventing the adhesion of the Cu(I)hfacTMVS thereto, such as about 55° C., by the external temperature regulating unit.

Gases produced by the reaction in the processing vessel 10 or all the unused gases remaining in the processing vessel 10 are sucked out of the processing vessel 10 through the discharge ports 32 by the evacuating system 14. $Cu(II)(hfac)_2$, Hhfac and TMVS separated from the Cu(I) hfacTMVS, and the unused Cu(I)hfacTMVS are sucked through the discharge ports 32 and the discharge pipe 34 into the high-temperature trapping device 28. If necessary, the discharge pipe 34, similarly to the walls of the processing vessel 10, may be maintained at a proper temperature, such as about 55° C.

The high-temperature trapping device 28 has trapping members and a heater for heating the trapping members at a predetermined reaction temperature. A gas sucked into the high-temperature trapping device 28 comes into contact with the trapping members, and substantially only and almost all the Cu(I)hfacTMVS contained in the gas undergo a reaction or are decomposed, selectively to deposit Cu(0), i.e., a reaction product, or make the same to adheres to the trapping members.

Desirably, the reaction temperature (or trapping temperature) of the trapping members of the high-temperature trapping device is in the range of 180 to 300° C. If the reaction temperature is below 180° C., it is difficult to make the Cu(I)hfacTMVS undergo perfectly the reaction expressed by Chemical formula (2) by the trapping members and it is possible that some part of the Cu(I)hfacTMVS flows through the high-temperature trapping device 28 into the vacuum pump 26. If the reaction temperature is higher than 300° C., it is possible that the decomposition of the Cu(II) $(hfac)_{2,1}$, though at a low reaction rate, proceeds and the amount of $Cu(II)(hfac)_2$ that can be recovered by the low-temperature trapping device 30 decreases.

Desirably, the trapping members of the high-temperature trapping device 28 is made of copper or is copper-plated. If a material other than copper, such as an insulating material, is exposed on the surfaces of the trapping members, there is the possibility that an incubation period is required for the reaction expressed by Chemical formula (2) to start, the reaction does not proceed for some time after the start of using the high-temperature trapping device 28 and unused Cu(I)hfacTMVS flows through the trapping members of the high-temperature trapping device 28 into the vacuum pump 26. Even if the reaction proceeds sufficiently long time after the start of using the high-temperature trapping device 28 and Cu(0) is deposited on the trapping surfaces of the trapping members, Cu(0) cannot deposit closely on and properly adhere to the surfaces of the trapping members. Consequently, there is the possibility that the deposited Cu(0) comes off the trapping surfaces of the trapping members, is sucked into the vacuum pump 26 and damages the vacuum pump 26. Such separation of Cu(0) from the trapping surfaces of the trapping members is liable to occur when the trapping members are subjected repeatedly to a heat cycle in which the temperature of the trapping members is raised and lowered alternately, and is remarkable when the difference in coefficient of thermal expansion between the material forming the trapping surfaces of the trapping members and deposited Cu(0) is large.

When the trapping surfaces of the trapping members of the high-temperature trapping device 28 is formed of copper, the incubation period of the reaction expressed by Chemical formula (2) can be excluded, the separation of the deposited Cu(0) from the trapping members can be suppressed because the respective coefficients of thermal expansion of the material forming the trapping surfaces of the trapping members and the deposited Cu(0) coincide with each other, and the vacuum pump 26 will not be damaged by Cu(0) separated from the trapping members and sucked into the vacuum pump 26.

The discharged gas obtained by removing all or substantially all the Cu(I)hfacTMVS from the gas discharged from the processing vessel 10 is sucked through the discharge pipe 36 into the vacuum pump 26. The principal component of the discharged gas is $Cu(II)(hfac)_2$. Most part of the $Cu(II)(hfac)_2$ is produced in the processing vessel 10 and the rest is produced in the high-temperature trapping device 28.

As mentioned above, the vacuum pump 26 is a dry vacuum pump, and the distributions of temperature and pressure in the vacuum pump 26 become irregular to some extent. The dry vacuum pump forces a sucked gas toward the discharge side to discharge the gas and, therefore, temperature and pressure on the discharge side of the dry vacuum pump are higher than those on the suction side of the same. However, temperature and pressure are distributed in ordinary dry pumps and mechanical booster pumps so that $Cu(II)(hfac)_2$ is able to remain in a gas phase while the same flows from the suction side to the discharge side.

Figure 2:
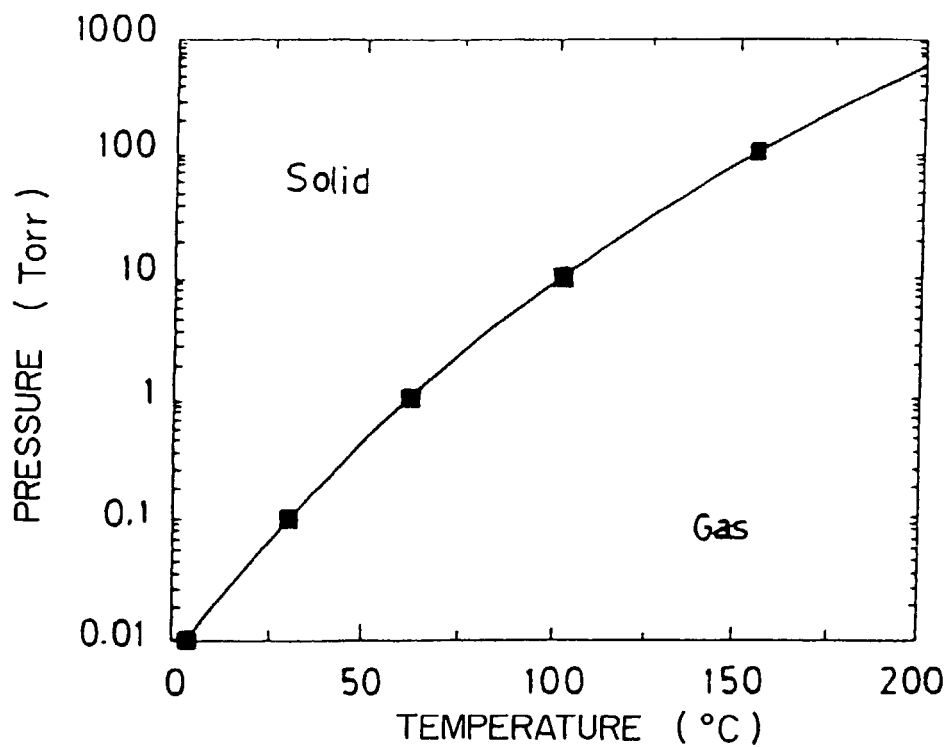
FIG. 2 is a graph showing a vapor pressure curve indicating the variation of the vapor pressure of $Cu(II)(hfac)_2$ with temperature.

FIG. 2 is a graph showing a vapor pressure curve indicating the variation of the vapor pressure of $Cu(II)(hfac)_2$ with temperature. In this embodiment, temperature and pressure are distributed in the vacuum pump 26 in the range of, for example, 60° C. (0.1 torr) to 150° C. (5 torr). Therefore $Cu(II)(hfac)_2$ does not condense in the vacuum pump 26. Normally, the internal temperature of dry pumps and mechanical booster pumps does not rise beyond 300° C. Therefore there is no possibility that $Cu(II)(hfac)_2$ is decomposed in the vacuum pump 26 because the decomposition temperature of $Cu(II)(hfac)_2$ is not lower than 350° C.

The vapor pressures of Hhfac and TMVS are still higher, and the decomposition temperatures and reaction temperatures of the same are considerably high. Therefore, Hhfac and TMVS are able to remain in a gas phase while the same flows through the evacuating system 14 including the vacuum pump 26.

Thus, most part of the discharged gas sucked into the vacuum pump 26 flows in a gas phase through the vacuum pump 26 and is discharged through the discharge port of the vacuum pump 26.

The discharged gas discharged from the vacuum pump 26 flows through the discharge pipe 38 into the low-temperature trapping device 30. As obvious from FIG. 2, $Cu(II)(hfac)_2$ becomes solid when the pressure is about 1 torr or above (becomes solid certainly when pressure is 10 torr or above) at 60° C. Pressure on the discharge side of the vacuum pump 26 is at least 10 torr or above (normally, 100 torr or above), $Cu(II)(hfac)_2$ can be condensed and trapped when the temperature of the trapping members of the low-temperature trapping device 30 is 60° C. or below.

Desirably, condensing temperature or trapping surface temperature for the low-temperature trapping device 30 is in the range of 15 to 60° C. As obvious from FIG. 2, $Cu(II)(hfac)_2$ changes from a gas phase to a solid phase more easily at lower temperature and higher pressure. The trapping temperature must be 60° C. or below for the efficient collection of $Cu(II)(hfac)_2$ at pressures in the range of pressure in which the pressure of the discharged gas on the discharge side of the vacuum pump 26 varies. If the trapping temperature is below 15° C., it is possible that $Cu(II)(hfac)_2$ gasifies actively, pressure in the low-temperature trapping device 30 rises and, in the worst case, the discharged gases jet out from the low-temperature trapping device 30 when the temperature of the low-temperature trapping device 30 rises to a room temperature when the cooling of the low-temperature trapping device is stopped for maintenance work, for example, for changing the trapping members. Therefore, it is preferable that the lower limit of the temperature of the low-temperature trapping device 30 is on the order of room temperature (15° C.).

If the surfaces of the trapping members of, for example, a stainless steel of the low-temperature trapping device 30 is exposed, there is the possibility that the trapping surface reacts with a solvent or a chemical liquid for dissolving $Cu(II)(hfac)_2$ condensed on the trapping members to recover the $Cu(II)(hfac)_2$ to cause contamination. This problem can be solved by coating the trapping surfaces of the trapping members with a fluorocarbon resin.

As mentioned above, in the low-pressure CVD system in this embodiment, Cu(I)hfacTMVS, i.e., a source gas, undergoes the reaction (decomposition) expressed by Chemical formula (2) in the processing vessel 10 to deposit Cu(0), i.e., a reaction product on the semiconductor wafer W in a copper film. $Cu(II)(hfac)_2$, i.e., a reaction byproduct, and unused Cu(I)hfacTMVS are discharged into the evacuating system 14.

In the evacuating system 14, the discharged gas discharged from the processing vessel 10 flows into-the high-temperature trapping device 28. In the high-temperature trapping device 28, substantially only and almost all the Cu(I)hfacTMVS undergoes the reaction and Cu(0) deposits on the trapping members of the high-temperature trapping device 28. Since the trapping members are made of copper or are copper-plated, the thermal decomposition of the Cu(I)hfacTMVS and the deposition of Cu(0) start immediately after the start of use of the high-temperature trapping device 28. The deposited Cu(0) adheres firmly to the trapping member and will not come off the trapping members.

The discharged gas discharged from the high-temperature trapping device 28 is sucked into the vacuum pump 26, i.e., a dry vacuum pump. The discharged gas sucked into the vacuum pump 26 is a mixed gas containing $Cu(II)(hfac)_2$, Hhfac and TMVS and substantially not containing Cu(I) hfacTMVS. Since Cu(I)hfacTMVS does not flow into the vacuum pump 26, it is possible to avoid perfectly damaging the vacuum pump 26 by condensed Cu(I)hfacTMVS or substances produced by the thermal decomposition of Cu(I) hfacTMVS.

The gases of $Cu(II)(hfac)_2$, Hhfac and TMVS are subject to neither thermal decomposition not condensation in the vacuum pump 26 and the same gases are discharged from the vacuum pump 26 into the low-temperature trapping device 30.

In the low-temperature trapping device 30, the $Cu(II)(hfac)_2$ undergoes condensation at a predetermined temperature and a predetermined pressure and is trapped by the trapping members. The trapping surfaces of the trapping members are coated with a fluorocarbon resin to prevent the contamination of condensed $Cu(II)(hfac)_2$ by the trapping members to recover $Cu(II)(hfac)_2$ of a high purity. The regeneration of Cu(I)hfacTMVS from the recovered $Cu(II)(hfac)_2$ is relatively easy. Thus, the source gas is saved and the running cost of the low-pressure CVD system can be reduced.

Figure 3:
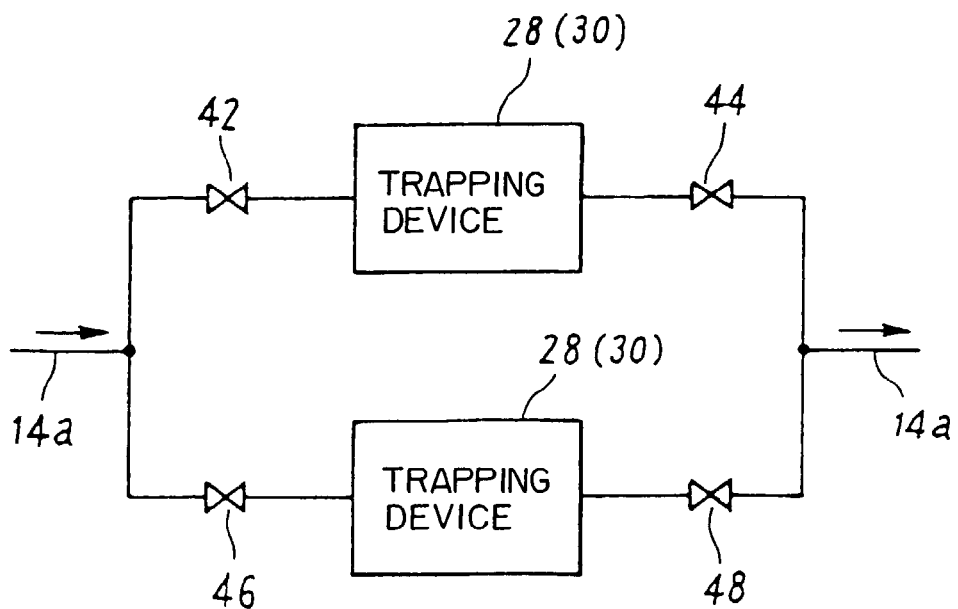
FIG. 3 is a circuit diagram showing trapping devices connected in a parallel arrangement in an embodiment of the present invention.

Two high-temperature trapping devices 28 two low-temperature trapping devices 30) may be placed in a discharge line 14a of the evacuating system 14 in a parallel arrangement, valves 42, 44 may be disposed above and below one of the two high-temperature trapping devices 28 (the two low-temperature trapping devices 30), and valves 46 and 48 may be disposed above and below the other high-temperature trapping device 28 (the other low-temperature trapping device 30) as shown in FIG. 3. When the two trapping devices 28 (30) are thus disposed in a parallel arrangement in the discharge line 14a, the trapping members of each of the trapping devices 28 (30) can be changed without stopping the film forming operation of the low-pressure CVD system.

Trapping devices according to the present invention to be used as the high-temperature trapping device 28 or the low-temperature trapping device of the low-pressure CVD system in the first embodiment will be described with reference to FIGS. 4 to 13.

Figure 4:
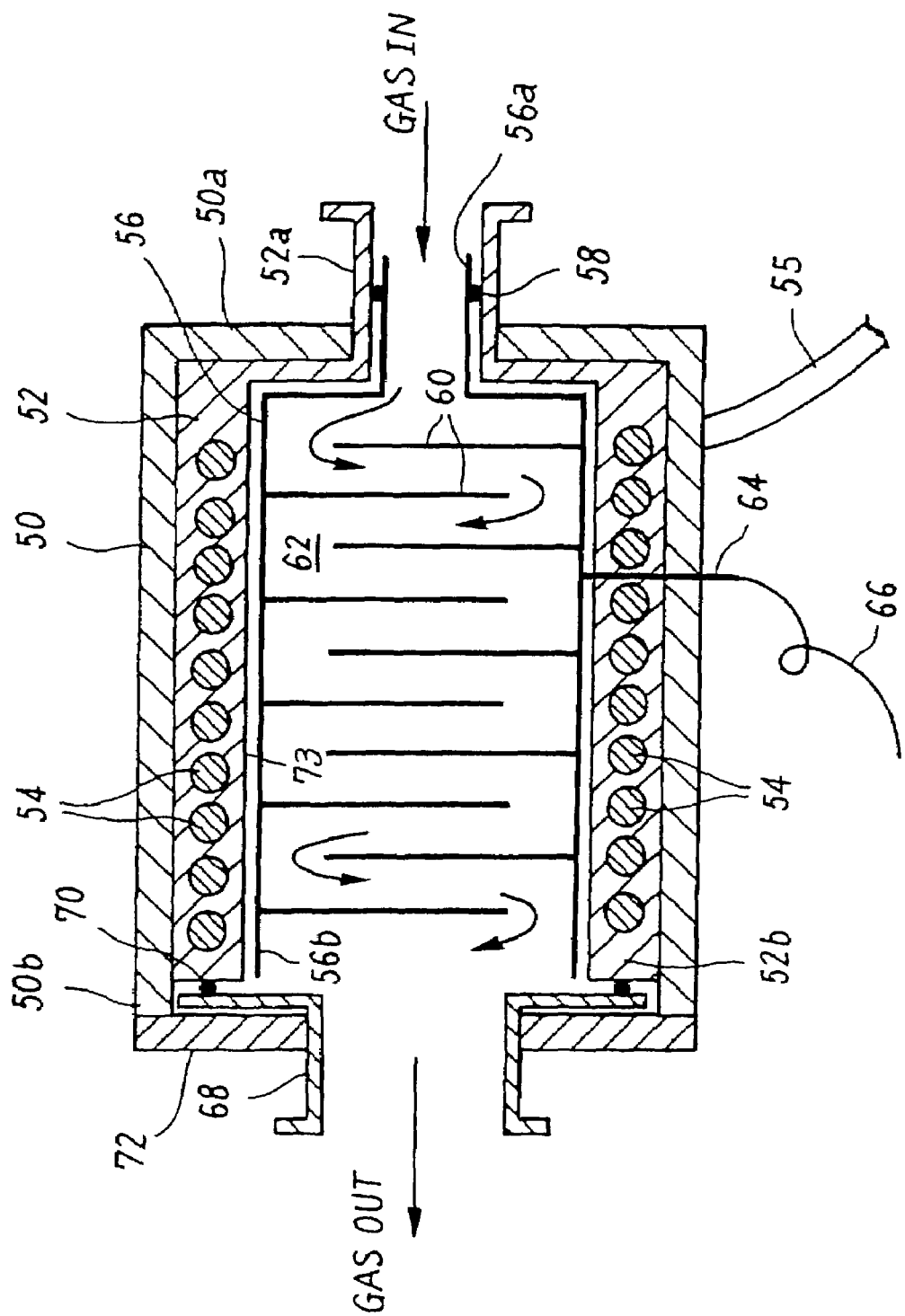
FIG. 4 is a schematic longitudinal sectional view of a trapping device in a first embodiment according to the present invention.

FIG. 4 shows a trapping device in a first embodiment according to the present invention suitable for use as the high-temperature trapping device 28.

Referring to FIG. 4, a housing 50 is made of a heat-insulating material, such as silicone rubber, in the shape of, for example, a rectangular cylinder. An end wall 50a provided with a gas inlet opening is formed at a first end (right end as viewed in FIG. 4). A second end (the other end) 50b of the housing 50 is open to receive a trapping unit therein through the second end 50b.

A heater body 52 made of a heat-conducting material, such as a stainless steel, in the shape of a rectangular cylinder similar to and smaller by one size than the housing 50 is fitted in the housing 50. A tubular projection 52a is formed at a first end (right end as viewed in FIG. 4) of the heater body 52. The tubular projection 52a projects axially outside through the opening formed in the end wall 50a of the housing 50 so as to define an inlet opening and to serve as a connector. A second end (the other end) 52b of the heater body 52, similarly to the second end 50b of the housing 50, is open.

A heating coil 54 of, for example, a tungsten wire is embedded in the side wall of the heater body 52. The heating coil 54 is connected by a cord 55 to a heater power supply circuit, not shown.

A trap body 56 formed from a copper plate in the shape of a rectangular cylinder similar to and smaller by one size than the heater body 52 is detachably inserted in the heater body 52 through the open second end 52b of the same. A tubular projection 56a is formed at a first end (right end as viewed in FIG. 4) of the trap body 56. The tubular projection 56a projects axially into the tubular projection 52a of the heater body 52. A sealing member 58, such as an O ring, is interposed between the tubular projection 52a of the heater body 52 and the tubular projection 56a of the trap body 56. A second end (the other end) 56b of the trap body 56 is open widely to permit the visual inspection of the interior of the trapping device to observe the deposition of copper, which will be described later.

Trapping plates 60 formed from a copper plate in the shape of a fin are extended alternately from a pair of opposite side walls of the trap body 56 so as to extend close to the opposite side walls, respectively.

The side edges of each trapping plate 60 are connected closely to the inner surfaces of the other pair of side walls of the trap body 56 so as to define a labyrinthine passage 62. A gas flowed through the tubular projection 56a into the trap body 56 flows from the inlet side of the trap body 56 through the labyrinthine passage 62 toward the outlet side of the trap body 56. As the gas flows through the labyrinthine passage 62, the gas touches the surfaces of the trapping plates 60 and the inner surface of the trap body 56 (trapping surfaces), a specific substance contained in the gas (Cu(I)hfacTMVS in this embodiment)undergoes reaction or decomposition and a reaction product (Cu(0))deposits on the trapping surfaces.

A thermocouple 64, i.e., a temperature sensor, is detachably attached to the trap body 56. The thermocouple 64 has an output terminal connected to a heater power controller by a wire 66. Power is supplied from the heater power supply circuit to the built-in heating coil 54 embedded in the heater body 52 to generate heat by the heater coil 54. Heat generated by the heater coil 54 is transferred through the heater body 52 to the trap body 56 to heat the trap body 56 and the trapping plates 60. The heater power controller controls power supply to the heating coil 54 so that the temperatures of the trap body 56 or the trapping plates 60 coincide with a predetermined reaction temperature or a predetermined trapping temperature.

One of two flanges formed at opposite ends of a tube 68 made of a stainless steel is fitted detachably in the second end 50b of the housing 50 with a sealing member 70, such as an O ring, interposed between the flange of the tube 68 and the end surface of the second end 52b of the heater body 52, and the flange of the tube 68 is fastened detachably to the heater body 52 with bolts, not shown. The tube 68 defines an outlet passage. An end plate 72 formed of a heat-insulating material, such as silicone rubber, is put on the tube 68

When using this trapping device as the high-temperature trapping device 28 of the low-pressure CVD system in the foregoing embodiment, the trap body 56 or the trapping plates 60 are heated at a temperature in the range of 180 to 300° C., for example, at 200° C. As the discharged gas discharged from the processing vessel 10 flows through the labyrinthine passage 62 formed in the trap body 56, Cu(I) hfacTMVS contained in the discharged gas touches the surfaces of the trapping plates 60 and the inner surfaces (trapping surfaces) of the trap body 56, undergoes the reaction (decomposition) expressed by Chemical formula (2), and Cu(0), i.e., a reaction product, deposits on or adheres to the trapping surfaces. Since the labyrinthine passage 62 in the trap body 56 is labyrinthine, the trapping surfaces to be in contact with the Cu(I)hfacTMVS has a sufficiently large contact area and the Cu(I)hfacTMVS is in contact with the trapping surfaces for a sufficiently long contact time. Consequently, substantially all the Cu(I)hfacTMVS undergoes the reaction before reaching the outlet passage.

Since the material forming the trapping surfaces is copper, the reaction of the Cu(I)hfacTMVS and deposition of Cu(0) can be started immediately without incubation period, the deposited Cu(0) adheres firmly the trapping surfaces and the deposited Cu(0) does not come off easily from the trapping surfaces.

Since the trap body 56 and the trapping plates 60 are formed of copper having high heat conductivity, heat generated by the heating coil 54 and transferred through the heater body 52 is used efficiently for the reaction.

The respective second ends of the housing 50 and the heater body 52 are opened by removing the end plate 72 and the tube 68. Therefore, the trap body 56 and the trapping plates 60 can be easily pulled out of the heater body 52, and the state of deposition of Cu(0) can be visually examined and recognized, so that time for replacing the trap body 56 or the trapping plate 60 with a new one can be properly determined and the trapping device is excellent in maintainability.

The sealing members 58 and 70 sealing the heater body 52 facilitates assembling and disassembling work. The sealing member 58 interposed between the tubular projection 52a of the heater body 52 and the tubular projection 56a of the trap body 56 prevents the entrance of the discharged gas containing Cu(I)hfacTMVS into the gap 73 between the trap body 56 and the heater body 52 and the deposition of Cu(I)hfacTMVS on the outer surface of the trap body 56. Since the discharged gas flowing near the outlet passage contains Cu(I)hfacTMVS scarcely, the gap 73 is opened to the labyrinthine passage 62 to facilitate handling the trap body 56.

The trap body 56 or the trapping plates 60 may be formed of a material other than copper, such as a stainless steel, and the trapping surfaces of the trap body 56 or the trapping plates 60 may not be copper-plated. After the trap body 56 or the trapping plates 60 have been used for a long operating time, the plated copper film may be removed from the trapping surfaces together with the deposited Cu(0) and the exposed trapping surfaces of the trap body 56 or the trapping plates 60 may be copper-plated again to recycle the trap body 56 or the trapping plates 60. When the trap body 56 or the trapping plates 60 are made of copper, the trap body 56 or the trapping plates 60 may be scrapped together with Cu(0) deposited thereon after Cu(0) has deposited to the full capacity of the trap body 56 or the trapping plates 60 to recycle the trap body 56 or the trapping plates 60, and the Cu(0).

Figure 5:
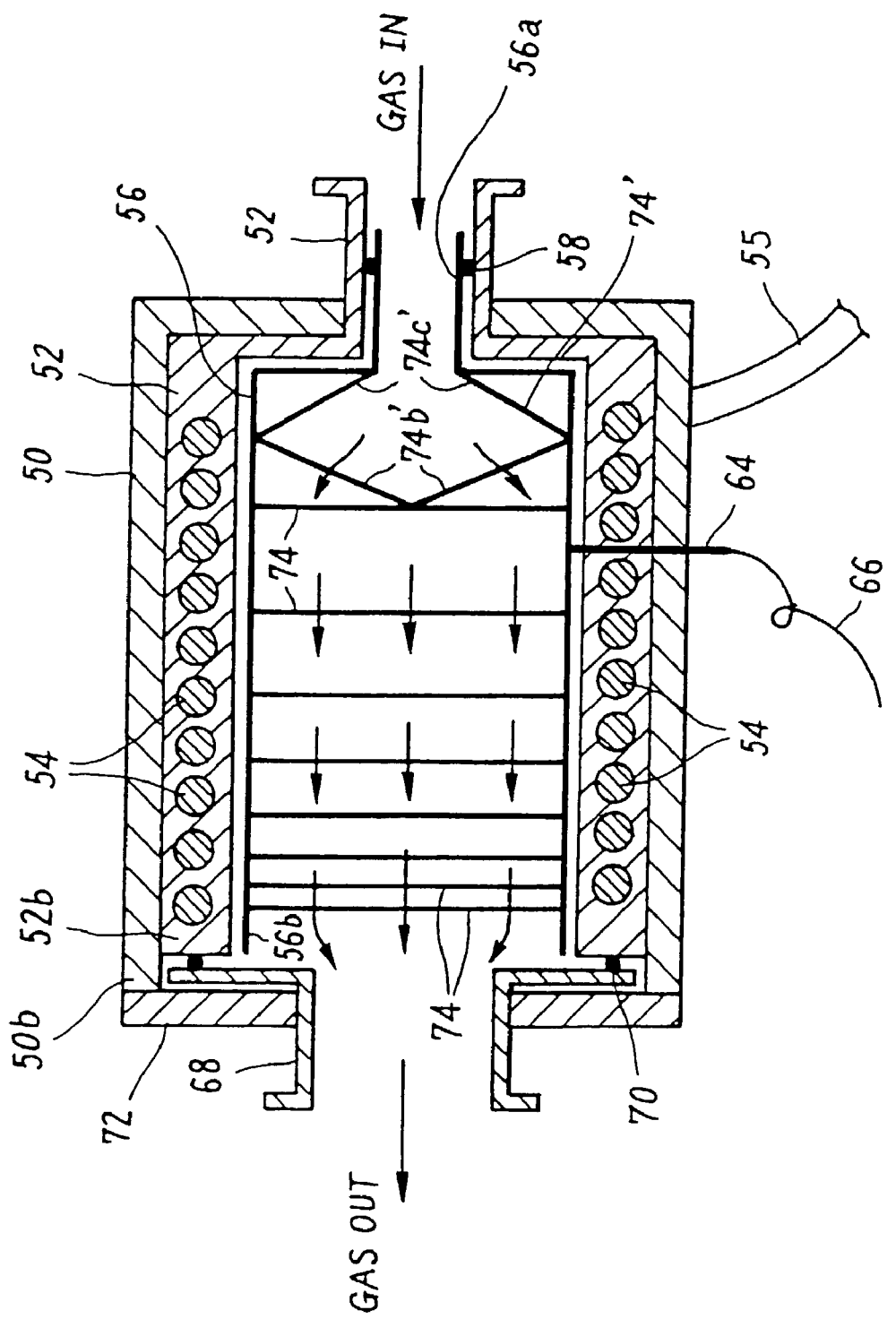
FIG. 5 is a schematic longitudinal sectional view of a trapping device in a second embodiment according to the present invention.

FIG. 5 shows a trapping device in a second embodiment according to the present invention. This trapping device is similar in construction and function to the trapping device in the first embodiment except that the inner construction of a trap body 56 thereof is a modification of that of the trap body 56 of the trapping device in the first embodiment.

Referring to FIG. 5, a plurality of trapping plates 74 are arranged axially at predetermined stepped intervals in the trap body 56. The four sides of each trapping plate 74 are joined closely to the inner surfaces of the four side walls of the trap body 56. Intervals between the trapping plates 74 decreases gradually from the inlet side toward the outlet side.

As shown in FIG. 6, each trapping plate 74 is provided with a plurality of openings 74a, the diameter of the holes 74a of the trapping plate 74 nearer to the inlet side is greater than that of the holes 74a of the trapping plate 74 nearer to the outlet side. The trapping plates may be different from each other in the number and the positions of the openings 74a.

The trapping plate 74' nearest to the inlet side is formed by bending a plate in a shape having a substantially rhombic cross section as shown in FIG. 5. The trapping plate 74 is provided with the openings 74a only in a pair of inner inclined walls 74*b*' thereof. A pair of outer inclined walls 74*c*' are not provided with any openings.

A gas introduced through an inlet opening into the trap body 56 flows into a buffer chamber defined by the trapping plate 74', and then flows through the openings 74*a* formed in the inclined walls 74*b*' in directions obliquely away from the longitudinal axis of the trap body 56. Then, the gas flows successively through openings 74*a* of the parallel trapping plates 74 and, finally, leaves an outlet opening. As the gas flows through the trapping device, the gas touches the surfaces of the trapping plates 74 and the inner surfaces (trapping surfaces) of the trap body 56 and Cu(I)hfacTMVS contained in the gas undergoes a reaction or decomposition and a reaction product, i.e., Cu(0), deposits on the trapping surfaces.

In the second embodiment, the buffering and diffusing effects of the trapping plate 74' suppress the reverse flow of the gas toward the inlet opening and the turbulent flow of the gas, and prevent the deposition of Cu(0) on the heater body 54 surrounding the trap body 56 and the associated piping, not shown.

The diameter of the openings 74*a* of the trapping plates 74 nearer to the inlet opening are greater than that of the openings 74*a* of the trapping plates 74 nearer to the outlet opening, and the intervals between the trapping plates 74 nearer to the outlet opening are smaller than that between the trapping plates 74 farther from the outlet opening. Therefore, the gas having a large unused gas concentration flows smoothly into the depth of the trap body 56 from a space around the inlet opening, the unused gas concentration of the gas decreases as the gas flows toward the outlet opening and the rate of contact of the gas with the trapping plates 74 increases toward the outlet opening. Therefore, Cu(0) deposits at equal deposition rates on the trapping plates 74 and, consequently, a large amount of Cu(0) will not be deposited on the trapping plates 74 nearer to the inlet opening and the openings 74*a* of the trapping plates 74 nearer to the inlet opening will not be stopped up with Cu(0) (deposit) while only a small amount of Cu(0) is deposited on the trapping plates 74 nearer to the outlet opening.

Other working effects of advantages of the second embodiment are similar to those of the first embodiment.

Figure 7:
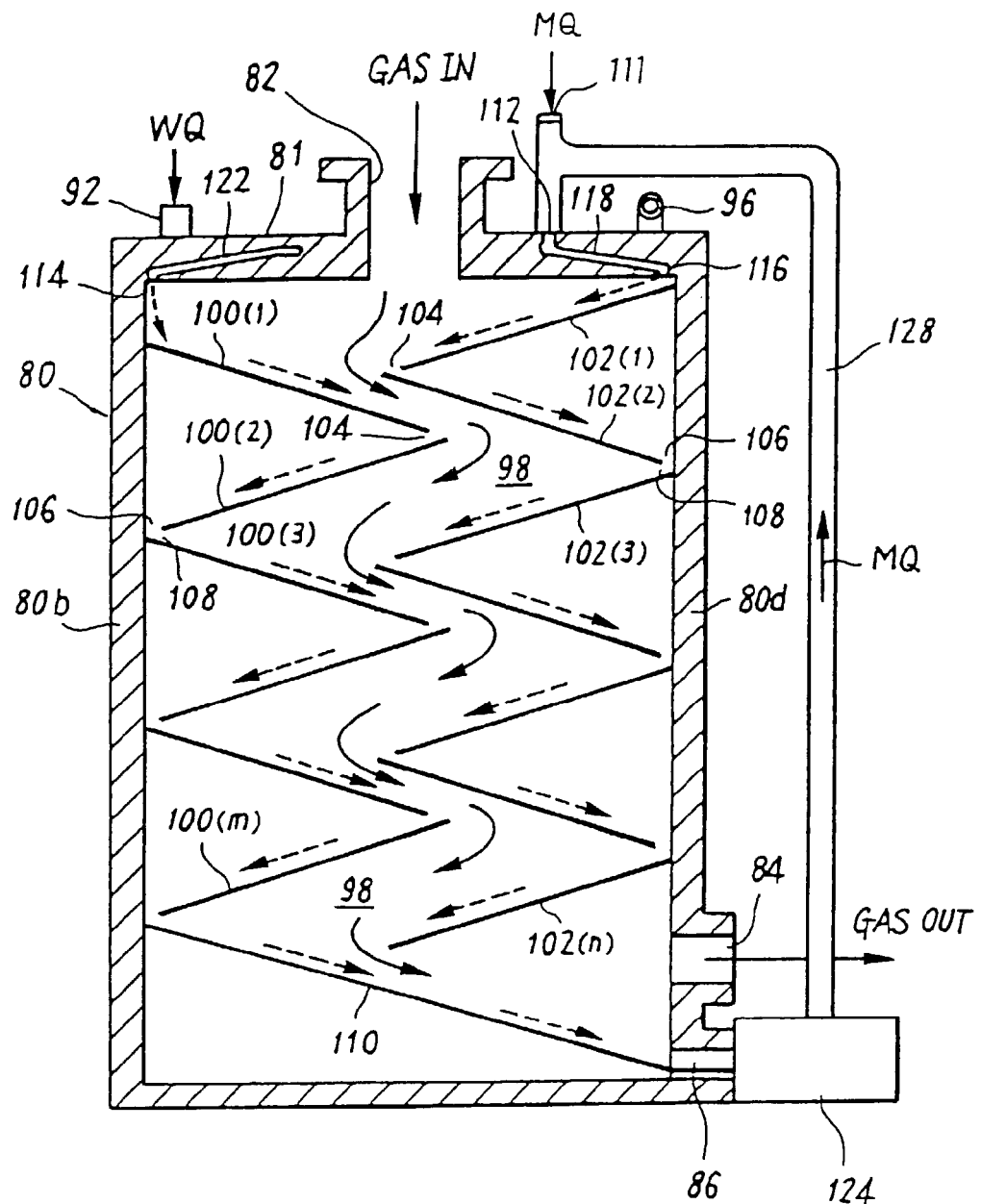
FIG. 7 is a schematic longitudinal sectional view of a trapping device in a third embodiment according to the present invention.
Figure 8:
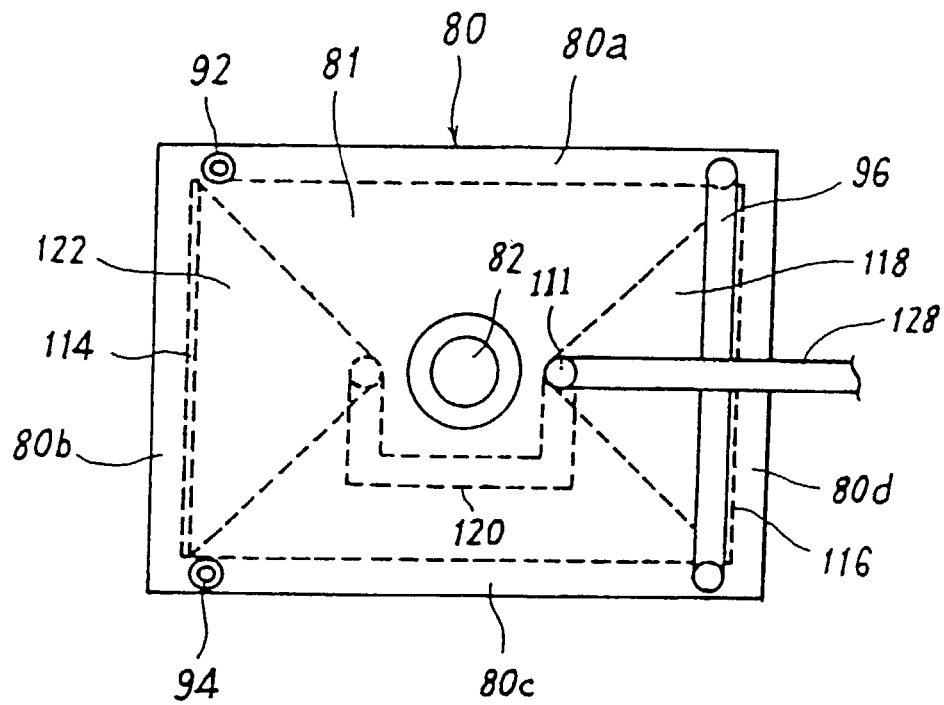
FIG. 8 is a top view of the trapping device in the third embodiment.
Figure 9:
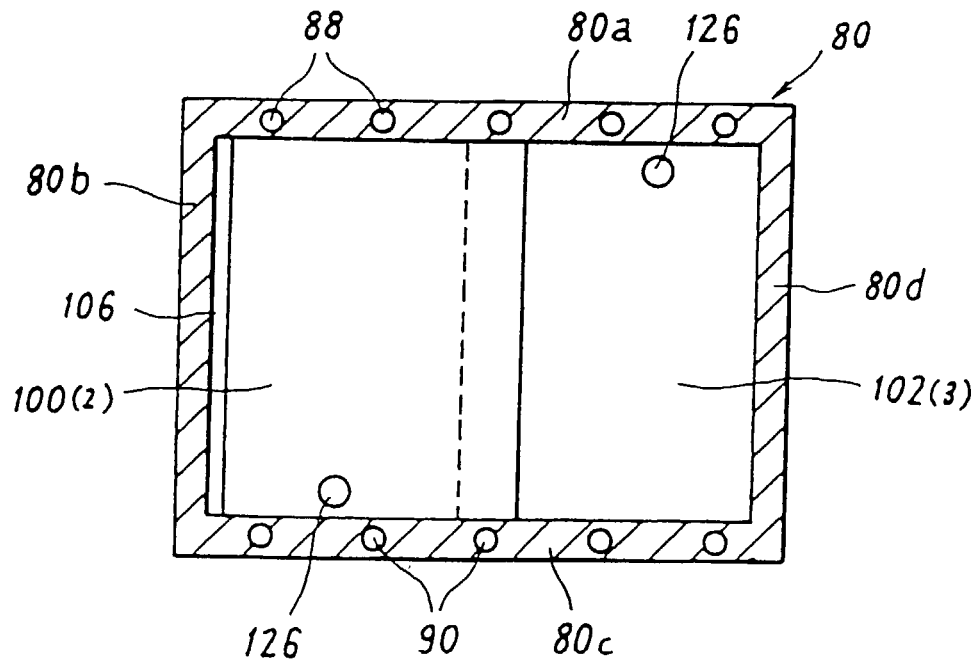
FIG. 9 is a schematic cross-sectional view of the trapping device in the third embodiment showing the arrangement of trapping plates.

FIGS. 7 to 9 show a trapping device in a third embodiment according to the present invention suitable for use as the low-temperature trapping device 30, in which FIG. 7 is a longitudinal sectional view, FIG. 8 is a top view and FIG. 9 is a cross-sectional view.

This trapping device has a housing 80 formed of a heat conducting material, such as a stainless steel in the shape of a bottomed rectangular cylinder. The housing 80 has a top wall serving as a top cover 81 and provided in its central part with an inlet opening 82, and a side wall provided in its lower part with an outlet opening 84 and a chemical liquid drain port 86.

The housing 80 has four side walls 80*a*, 80*b*, 80*c* and 80*d*. Water passages 88 and 90 for passing temperature regulating water are formed in the opposite side walls 80*a* and 80*c*, respectively, as shown in FIG. 9. The top cover 81 of the housing 80 is provided with an water inlet port 92 connected to the water passage 88 formed in the side wall 80*a*, and a water outlet port 94 connected to the water passage 90 formed in the side wall 80*c* as shown in FIG. 8. As shown in FIG. 8, the water passages 88 and 90 are connected by a bypass pipe 96 extended on the upper surface of the housing 80.

A temperature regulating water supply unit, not shown, supplies water WQ of a predetermined temperature to the housing 80 through a pipe, not shown, connected to the water inlet port 92. The water WQ flows through the water passage 88 in the side wall 80*a*, the bypass pipe 96 and the water passage 90, and is discharged through the water outlet port 94. The water WQ discharged from the housing 80 is returned pipe, not shown, to the temperature regulating water supply unit. The water WQ is thus circulated to cool or heat the housing 80 and trapping members disposed in the housing 80 at a temperature nearly equal to the temperature of the water WQ.

As shown in FIG. 7, a zigzag gas passage 98 is formed in the housing 80 between the gas inlet opening 82 and the gas outlet opening 84. The gas passage 98 is defined by two vertical columns of trapping plates, namely, a first trapping plate column of trapping plates 100(1), 100(2), . . . and 100(m), and a second trapping plate column of trapping plates 102(1), 102(2), . . . and 102(n).

In the first trapping plate column, i.e., the left trapping plate column as viewed in FIG. 7, the trapping plates 100(1), 100(2), . . . and 100(m) are inclined alternately in opposite directions in a zigzag arrangement.

More specifically, the top trapping plate 100(1) is extended obliquely downward from the inner surface of the side wall 80*b* of the housing 80 to a position slightly beyond a central plane of the housing 80. The second trapping plate 100(2) is extended obliquely downward from a position slightly below the lower edge of the top trapping plate 100(1) to a position slightly inside the inner surface of the side wall 80*b* so as to form a gap 106 between the lower edge thereof and the inner surface of the side wall 80*b*. The third trapping plate 100(3) is extended, similarly to the top trapping plate 100(1), obliquely down ward from the inner surface of the side wall 80*b* to a position slightly beyond the central plane so as to form a small gap 108 between the third trapping plate 100(3) and the lower edge of the second trapping plate 100(2). The fourth trapping plates 100(4), 100(5), . . . and 100(m) are arranged successively in the same arrangement.

The second trapping plate column is displaced vertically by a small height relative to the first trapping plate column. In the second trapping plate column, i.e., the right trapping plate column as viewed in FIG. 7, the trapping plates 102(1), 102(2), . . . and 102(n) are inclined, similarly to the trapping plates 100(1), 100(2), . . . and 100(m), alternately in opposite directions in a zigzag arrangement. Thus, a zigzag gas passage 98 is formed between the first and the second trapping plate columns. The trapping plates 100 and 102 are joined or connected closely to the side walls 80*a* and 80*c* or the housing 80, respectively, as shown in FIG. 9.

A bottom trapping plate 110 is disposed in a bottom part of the interior of the housing 80 to guide all the gas flowed along the trapping plates to the outlet opening 84. The sour sides of the bottom trapping plate 110 are joined or connected closely to the side walls 80*a*, 80*b*, 80*c* and 80*d*, respectively.

The trapping plates 100, 102 and 110 are formed of a material having a high thermal conductivity, such as aluminum, and the surfaces of the same are coated with a fluorocarbon resin.

In this trapping device, a deposit (Cu(II)(hfac)$_2$ in this embodiment) adhering to the trapping plates 100, 102 and 110 is recovered in the housing 80 by the following means.

The top cover 81 of the housing 80 is provided with a chemical liquid supply port 112 through which a chemical liquid MQ capable of dissolving the deposit (Cu(II)(hfac)$_2$), such as acetone, is supplied. A chemical liquid pouring pipe 111 is connected to the chemical liquid supply port 112.

Chemical liquid passages 118, 120 and 122 are formed in the top cover 81 to connect the chemical liquid supply port 112 to chemical liquid discharge slits 114 and 116 formed in upper end parts of the side walls 80b and 80d of the housing 80. The chemical liquid passage 118 expands downward in a fan form to the chemical liquid discharge slit 116. The chemical liquid passage 122 expands obliquely downward in a fan form from a position opposite the chemical liquid supply port 112 with respect to the gas inlet opening 82 to the chemical liquid discharge slit 114. The chemical liquid passage 120 extends around the gas inlet opening so as to connect the chemical liquid supply port 112 to the chemical liquid passage 122.

The chemical liquid MQ is supplied through the chemical liquid pouring pipe 111. Normally the chemical liquid pouring pipe 111 is closed by a cover.

Part of the chemical liquid MQ supplied through the chemical liquid supply port 112 is distributed to the chemical liquid passage 118 and the rest is distributed through the chemical liquid passage 120 to the chemical liquid passage 122.

The chemical liquid MQ distributed to the right chemical liquid passage 118 flows through the chemical liquid discharge slit 116 and along the inner surface of the side wall 80d onto the top trapping plate 102(1) of the second trapping plate column.

As indicated by the arrows and dotted lines in FIG. 7, the chemical liquid MQ supplied to an upper part of the top trapping plate 102(1) flows down along the upper surface of the trapping plate 102(1), drops from the lower end of the trapping plate 102(1) through the gap 104 onto an upper part of the second trapping plate 102(2), flows along the upper surface of the trapping plate 102(2), and drops from the lower end of the trapping plate 102(2) through the gaps 106 and 108 onto an upper part of the third trapping plate 102(3). Thus, the chemical liquid MQ flows successively along the upper surfaces of the trapping plates 102(4), 102(5), . . . and 102(n) and, finally flows along the bottom trapping plate 110 and is drained through the chemical liquid drain port 86 into a chemical liquid tank 124.

The chemical liquid MQ supplied onto the top trapping plate 102(1) flows down successively along the trapping plates 102(1), 102(2), . . . 102(n) and the-bottom trapping plate 110, is drained through the chemical liquid drain port 86 and is collected in the chemical liquid tank 124.

The chemical liquid MQ distributed to the left chemical liquid passage 122 flows through the left chemical liquid discharge slit 114 and along the inner surface of the side wall 80b onto an upper part of the left top trapping plate 100(1). As indicated by the allows and dotted lines in FIG. 7, the chemical liquid flows, similarly to the flow of the chemical liquid in the second trapping plate column, successively along the upper surfaces of the trapping plates 100(1), 102(2), . . . and 100(m) and, finally flows along the bottom trapping plate 110 and is drained through the chemical liquid drain port 86 into a chemical liquid tank 124.

As shown in FIG. 9, ultrasonic vibrators 126 are attached to the trapping plates 100 and 102, respectively. When the chemical liquid MQ is supplied to the trapping plate columns, the ultrasonic vibrators 126 are actuated to vibrate the trapping plates 100 and 102. An ultrasonic vibrator may be attached also to the bottom trapping plate 110.

A pump, not shown, has a suction port connected to the chemical liquid tank 124 and a discharge port connected by a pipe 128 to the chemical liquid pouring pipe 111 connected to the chemical liquid supply port 112. The chemical liquid MQ stored or collected in the chemical liquid tank 124 is pumped by the pump to supply the same through the pipe 128 to the chemical liquid supply port 112. The chemical liquid MQ is thus circulated.

The operation of this trapping device as used as the low-temperature trapping device 30 of the low-pressure CVD system shown in FIG. 1 will be described.

Water CW of a predetermined temperature, such as 25° C., is supplied through the water inlet port 92. The water CW flows through the water passages 88 and 90 formed in the side walls 80a and 80c of the housing 80 to cool and maintain the trapping plates 100 and 102 closely joined or connected to the side walls 80a and 80c of the housing 80 at about 25° C.

The discharged gas discharged from the vacuum pump 26 is supplied through the gas inlet opening 82 into the trapping device. As mentioned above, the discharged gas contains $Cu(II)(hfac)_2$, i.e., a reaction product. Most part of the discharged gas flows through the zigzag gas passage 98 defined between the first trapping plate column of the trapping plates 100(1), 100(2), . . . and 100(m) and the second trapping plate column of the trapping plates 102(1), 102(2), . . . and 102(n), and flows out of the trapping device through the outlet opening 84. In this description, the surfaces of the trapping plates facing the gas passage 98 are called "primary trapping surfaces" and that of the trapping plates not facing the gas passage 98, i.e., the back surfaces, are called "secondary trapping surfaces".

The discharged gas is compressed in the gas passage 98 having a small conductance and touches the primary trapping surfaces of the trapping plates 100, 102 and 110 as the same flows through the gas passages 98. Consequently, the $Cu(II)(hfac)_2$ contained in the discharged gas is cooled at the cooling temperature (about 25° C.) and condenses on the trapping plates 100, 102 and 110. The thus deposited $Cu(II)(hfac)_2$ adheres or sticks to the trapping surfaces.

There is a tendency for a greater amount of the $Cu(II)(hfac)_2$ deposits on the trapping plates 100 and 102 nearer to the gas inlet opening 82. There is a tendency for a larger amount of the $Cu(II)(hfac)_2$ deposits on the odd trapping plate (for example, the trapping plate 102(3)) of the two vertically adjacent trapping plates (for example, the trapping plates 102(2) and 102(3)) than on the even trapping plate (for example, the trapping plate 102(2)). Since the primary trapping surface of the odd trapping plates (102(3)) faces up, the gas flowing downward impinges on and touches the same primary trapping surface heavily and the $Cu(II)(hfac)_2$ is subject to deposition on the primary trapping surface of the odd trapping plate (102(3)) accordingly. Since the main trapping surface of the even trapping plate (100(2)) faces down, the gas flowing downward impinges on and touches the same trapping surface lightly and hence the deposition of the $Cu(II)(hfac)_2$ on the same trapping surface is difficult.

Part of the gas flows through the gaps 104, 106 and 108, along the secondary trapping surfaces of the trapping plates 100 and 102 to the outlet opening 84. A relatively small amount of the $Cu(II)(hfac)_2$ contained in the gas deposits on the secondary trapping surfaces of the trapping plates 100 and 102.

In this trapping device, the trapping surfaces of the trapping plates 100, 102 and 110 are coated with a fluorocarbon resin. Therefore, the deposited $Cu(II)(hfac)_2$ can be safely and stably held on the trapping surfaces.

A deposit recovering operation for recovering the deposited $Cu(II)(hfac)_2$ may be carried out after the amount of the deposited $Cu(II)(hfac)_2$ has increased to a considerably high level.

In the deposit recovering operation, the temperature regulating water supply unit supplies water CW of a predetermined heating temperature of, for example, 50° C. through the water inlet port 92 into the water passages 88 and 90 of the side walls 80*a* and 80*c*. The trapping plates 100 and 102 closely joined or connected to the side walls 80*a* and 80*b* of the housing 80 are heated at about 50° C. by the water CW flowing through the water passages 88 and 90 of the side walls 80*a* and 80*c*.

The pump is operated to pump the chemical liquid MQ from the chemical liquid tank 124 into the liquid passages 118, 120 and 122. Then, the chemical liquid MQ flows along the trapping plates 100(1), 100(2), . . . and 100(m) of the first trapping plate column, the trapping plates 102(1), 102(2), . . . and 102(n) of the second trapping plate column and the trapping plate 110, dissolving and washing away the Cu(II)(hfac)$_2$ deposited on the trapping surfaces of the trapping plates 100, 102 and 110.

The trapping plates 100 and 102 are heated at the predetermined temperature (about 50° C.) and the trapping plates 100, 102 and 110 are vibrated by the ultrasonic vibrators 126 to dissolve the Cu(II)(hfac)$_2$ efficiently.

The deposited Cu(II)(hfac)$_2$ can be dissolved and recovered by circulating a relatively small amount of the chemical liquid MQ.

Since the trapping surfaces of the trapping plates 100, 102 and 110 are coated with the fluorocarbon resin, there is no possibility that the trapping surfaces react with the chemical liquid MQ or the trapping surfaces are deteriorated by the chemical liquid MQ during the deposit recovering operation and contamination will not occur.

The chemical liquid MQ flows down along the primary trapping surfaces of the odd trapping plates and along the secondary trapping surfaces of the even trapping plates; that is the chemical liquid MQ does not spread over the secondary trapping surfaces of the odd trapping plates and the primary trapping surfaces of the even trapping plates. However, the amount of the deposit on the secondary trapping surfaces of the odd trapping plates is very small, and the amount of the deposit on the primary trapping surfaces of the even trapping plates is relatively small.

The amount of the deposit on the primary trapping surfaces of the odd trapping plates 100(1), 100(3), . . . and 102(1), 102(3), . . . Since the chemical liquid MQ is supplied sufficiently to the primary trapping surfaces of the odd trapping plates, most part of the deposited Cu(II)(hfac)$_2$ can be recovered.

When the pump is stopped to stop circulating the chemical liquid MQ, the Cu(II)(hfac)$_2$ washed away from the trapping plates 100, 102 and 110 is collected together with the chemical liquid MQ and is stored in the tank 124. The chemical liquid MQ collected in the tank 124 is processed to convert the Cu(II)(hfac)$_2$ into Cu(I)hfacTMVS.

Figure 11:
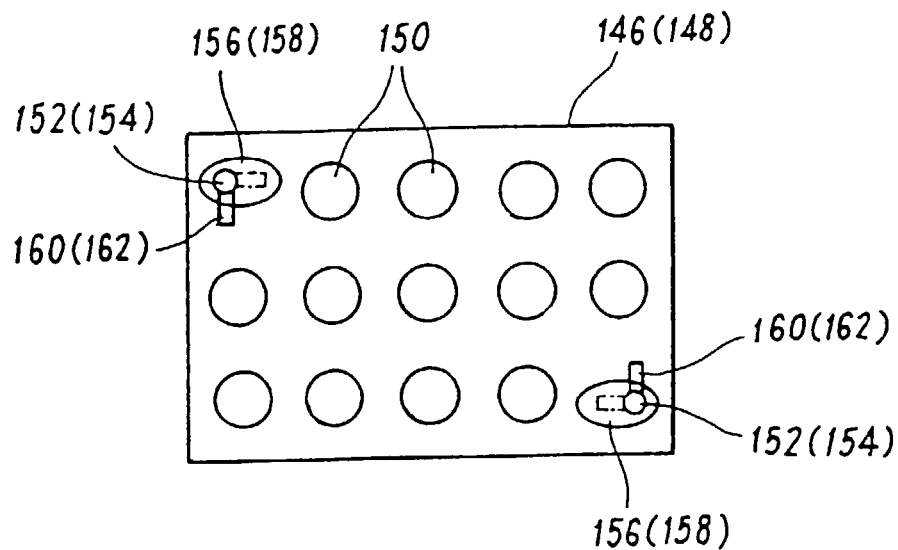
FIG. 11 is a plan view showing a trapping plate and a support member included in the trapping device in the fourth embodiment.
Figure 12:
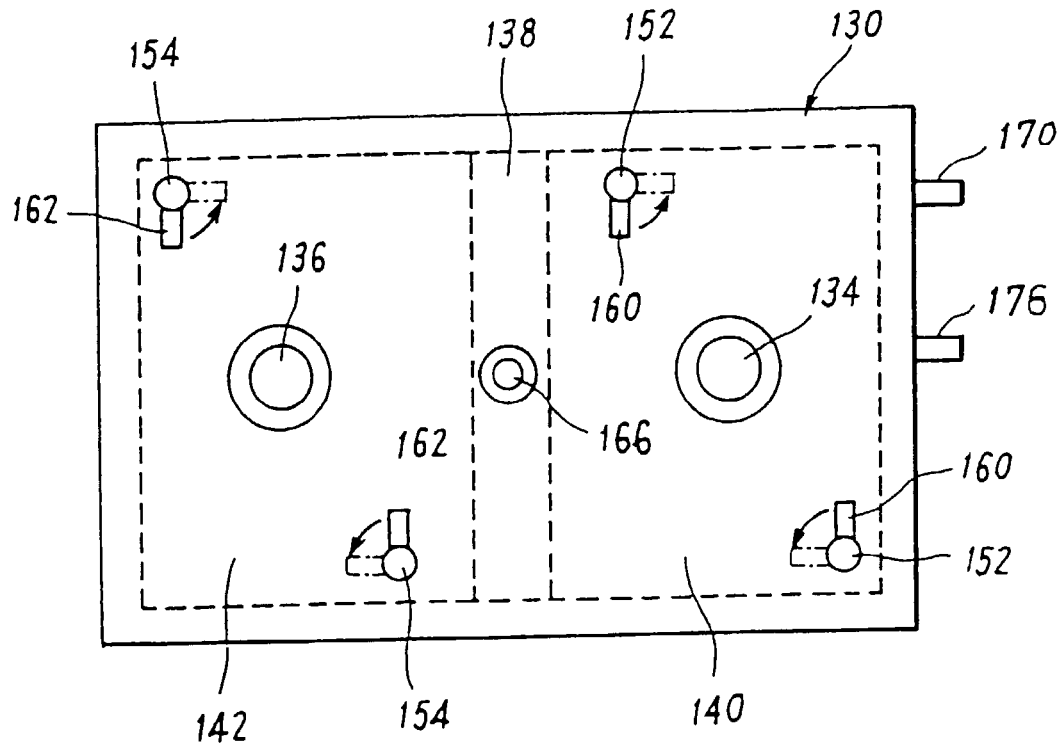
FIG. 12 is a top view of the trapping device in the fourth embodiment.
Figure 13:
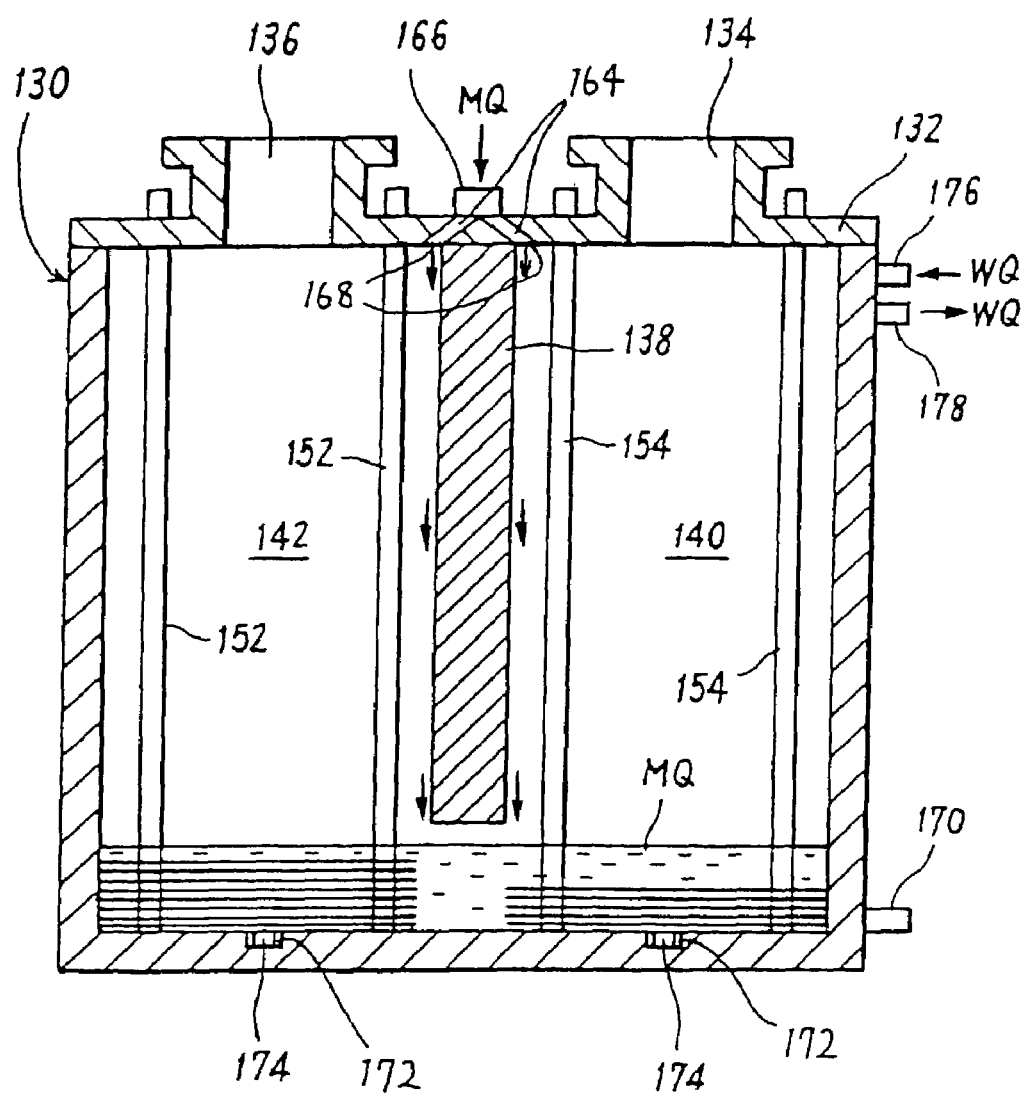
FIG. 13 is a schematic longitudinal sectional view of the trapping device in the fourth embodiment in state for condensate recovering work.

FIGS. 10 to 13 show a trapping device in a fourth embodiment according to the present invention suitable for use as the low-temperature trapping device 30, in which FIGS. 10 and 13 are longitudinal sectional views, FIG. 11 is a plan view of a trapping plate and support members and FIG. 12 is a top view.

This trapping device has a housing 130 formed of a heat-conductive material, such as aluminum in the shape of a bottomed rectangular cylinder. The open upper end of the housing 130 is covered with a top cover 132 provided with an inlet opening 134 and an outlet opening 136 for a gas.

The interior space of the housing 130 is divided into a first chamber 140 and a second chamber 142 by a partition wall 138 made of, for example, aluminum. The chambers 140 and 142 communicate with each other by means of an opening 144 formed between the lower end of the partition wall 1 and the bottom wall of the housing 130.

A plurality of trapping plates 146 made of a heat-conductive material, such as aluminum, are arranged vertically at predetermined intervals in the first chamber 140. The intervals between the trapping plates 146 nearer to the inlet opening 134 are greater than those between the trapping plates 146 nearer to the bottom of the first chamber 140; that is, the intervals decreases downstream with respect to the flowing direction of the gas.

A plurality of trapping plates 148 made of a heat-conductive material, such as aluminum, are arranged vertically at predetermined intervals in the second chamber 142. The intervals between the trapping plates 148 nearer to the bottom of the second chamber 142 are greater than those between the trapping plates 148 nearer to the outlet opening 136; that is, the intervals decreases downstream with respect to the flowing direction of the gas. The interval between the two bottom trapping plates 148 in the second chamber 142 is about equal to or smaller than that between the two bottom trapping plates 146 in the first chamber 140.

As shown in FIG. 11, each of the trapping plates 146 and 148 are provided with a plurality of openings 150. Similarly to the trapping plates 74 of the trapping device shown in FIG. 5, The diameter of the openings 150 of the upstream trapping plates 146 (148) may be greater than that of the openings 150 of the downstream trapping plates 146 (148). The trapping plates 146 and 148 may be different from each other in the number and the positions of the openings 150.

The trapping surfaces of the trapping plates 146 and 148 are coated with a fluorocarbon resin. In this trapping device, the inner surface of the housing 130 and the surfaces of the partition wall 138 are coated with a fluorocarbon resin because those surfaces are used also as trapping means.

In the housing 130, the trapping plates 146 (148) are supported detachably on a pair of vertical support rods 152 (154). As shown in FIG. 11, a pair of elliptic openings 156 (158) are formed in a pair of diagonally opposite corners of each trapping plate 146 (148) to pass the support rods 152 (154). The support rods 152 (154) are provided with horizontal support projections 160 (162) at levels corresponding to those of the lower surfaces of the trapping plates 146 (148). In a state where the trapping device is assembled as shown in FIG. 10, the horizontal support projections 160 (162) are extended in parallel to the minor axes of the elliptic openings 156 (158) to support the trapping plates 146 (148).

The vertical support rods 152 (154) extend through the top cover 132 and project upward from the upper surface of the housing 130, and an operating lever (or a knob) 160 (162) is attached to an upper end part of each of the vertical support rods 152 (154).

When recovering Cu(II)(hfac)$_2$ deposited on the trapping plates 146 (148), the levers (or the knobs) 160 (162) are turned in the directions of the arrows shown in FIG. 12. Then the horizontal support projections 160 (162) of the vertical support rods 152 (154) are extended in parallel to the major axes of the elliptic openings 156 (158), so that the trapping plates 146 (148) drop down.

As shown in FIG. 13, the trapping plates 146 (148) released from the vertical support rods 152 (154) and dropped down are piled up on top of one another in bottom of the chambers 140 and 142, respectively.

In this trapping device, chemical liquid supply passages 164 are formed in the top cover 132 so that a chemical liquid MQ supplied through the chemical liquid supply passages 164 flows along the partition wall 138 disposed inside the housing 130. The top cover 132 is provided with a chemical liquid pouring port 166 connected to the chemical liquid supply passages 164. The chemical liquid MQ poured into the chemical liquid pouring port 166 flows through discharge openings 168 near the upper end of the partition wall 138 and flows down along the partition wall 138 toward the bottom of the housing 130.

A drain port 170 is formed in a lower part of one of the side walls of the housing 130. Normally the drain port 170 is closed. Therefore, the chemical liquid MQ supplied through the chemical liquid supply passages 164 into the housing 130 collects in a bottom part of the housing 130 and the piled trapping plates 146 (148) are immersed in the chemical liquid MQ.

A plurality of recesses 172 are formed in the bottom surface of the housing 130 and ultrasonic vibrators 174 are placed in the recesses 172. While the trapping plates 146 (148) are immersed in the chemical liquid MQ in the bottom part of the housing 130, the ultrasonic vibrators 174 are actuated to apply vibrations to the trapping plates 146 (148) in order to promote the dissolution of a deposit $(Cu(II)(hfac)_2)$ in the chemical liquid MQ.

After the deposit $(Cu(II)(hfac)_2$ has dissolved in the chemical liquid MQ by the immersion of the trapping plates 146 (148) in the chemical liquid MQ for a predetermined time period, a solution is drained through the drain port 170, and the solution is processed to convert the $Cu(II)(hfac)_2$ into Cu(I)hfacTMVS for recycling.

This trapping device also is provided with a temperature regulating water circulating system. A temperature regulating water inlet port 176 and a temperature regulating water outlet port 178 are formed in one of the side walls of the housing 130. The temperature regulating water inlet port 176 and the temperature regulating water outlet port 178 are connected to an inlet end of one or a plurality of temperature regulating water passages arranged in a part of side walls or in all the side walls of the housing 130 and an outlet end of the same passage or passages, respectively.

When using the trapping device, water WQ of a predetermined cooling temperature is supplied to and circulated through the temperature regulating water circulating system. When recovering the deposit $(Cu(II)(hfac)_2)$ water WQ of a predetermined heating temperature is supplied to and circulated through the temperature regulating water circulating system. In this trapping device, the trapping plates 146 (148) are immersed in the chemical liquid MQ collected in the bottom part of the housing 130 dissolve the deposit (Cu(II)(hfac)$_2$). Therefore, substantially all the deposit can be recovered.

The trapping surfaces of this trapping device, similarly to those of the trapping device in the third embodiment, are coated with a fluorocarbon resin. Therefore, the deposit is held stably during a trapping operation, the trapping surfaces do not undergo any reaction and are not deteriorated by a recovering process and contamination does not occur.

The trapping plates 146 (148) dropped down for the recovering work can be set again at their working positions by removing the top cover 132, taking the trapping plates 146 (148) outside the housing 130 together with the support rods 152 (154), setting the trapping plates 146 (148) at their working positions on the support rods, and returning the assembly of the trapping plates 146 (148) and the support rods 152 (154).

Although the invention has been described in its preferred embodiment, obviously many modifications and variations thereof are possible without departing from the scope of the invention. Although the invention has been described on an assumption that the source gas is Cu(I)hfacTMVS, copper films can be formed by the low-pressure CVD system by using an organic copper compound other than Cu(I)hfacTMVS as a source gas. The processing system, the evacuating system and the trapping device according to the present invention can be applied to various low-pressure CVD processes and microprocesses other than the copper film forming process.

As apparent from the foregoing description, the processing system and the evacuating system according to the present invention is capable of ensuring the stable operation of the vacuum pump for sucking out the unused source gas and gases as reaction byproducts from the low-pressure processing chamber, of efficiently recovering the reaction byproducts for the effective utilization of resources and of reducing the running cost.

The trapping device according to the present invention is capable of selectively and surely trapping only the unused source gas contained in the gas discharged from the processing chamber. The trapping device according to the present invention is capable of efficiently recovering the trapped organic compound.

What is claimed is:

1. A trapping device for heating a predetermined gas-phase substance for reaction and trapping a reaction product, comprising:
   a tubular housing having open opposite ends;
   a tubular trapping body provided with an gas inlet part and a gas outlet part formed respectively at opposite ends thereof, and inserted through either of the open ends of the housing in the housing so as to be detachably contained in the housing with the gas inlet part placed at one of the open ends of the housing and the gas outlet part placed at the other open end of the housing;
   trapping members placed in a gas passage between the gas inlet part and the gas outlet part of the trapping body so as to be in contact with the gas-phase substance introduced through the gas inlet part into the trapping body to make the reaction product deposit thereon; and
   a heating means for heating the trapping members at a predetermined temperature, wherein the heating means is disposed in a space between an outer circumference of the trapping body and an inner circumference of the housing.

2. A trapping device for condensing a predetermined organic gas and to trap a condensed organic compound, comprising:
   a housing having a gas inlet opening, a gas outlet opening and a gas passage extending between the gas inlet opening and the gas outlet opening;
   trapping members disposed in the housing so as to extend along the gas passage and having condensing surfaces to condense the organic gas introduced through the gas inlet opening into the housing thereon;
   a heating/cooling passage for passing media for cooling and heating the trapping members;
   a chemical liquid supply means for supplying a chemical liquid for dissolving the organic compound adhering to a part of the condensing surfaces of the trapping members or to the entire condensing surfaces of the same; and
   a chemical liquid recovering means for recovering the chemical liquid containing the organic compound dissolved therein,
   wherein the heating/cooling passage is combined thermally with the trapping members, a cooling heat transfer medium is passed through the heating/cooling passage when making the organic gas condense on the trapping members, and a heating heat transfer medium is passed through the same when dissolving the organic compound adhering to the trapping members in the chemical liquid.

3. The trapping device according to claim 2, wherein the trapping members include a plurality of trapping plates vertically arranged in a zigzag arrangement with the alternate inclined condensing surfaces thereof directed in opposite directions, respectively, and the chemical liquid supply means has a chemical liquid supply passage for supplying the chemical liquid onto the uppermost trapping plate so that the chemical liquid flows down successively along the trapping plates from the higher to the lower trapping plates.

4. The trapping device according to claim 2, wherein the chemical liquid recovering means includes a chemical liquid returning means for returning the recovered chemical liquid to the chemical liquid supply passage of the chemical liquid supply means.

5. The trapping device according to claim 2, wherein the trapping members include a plurality of trapping plates vertically arranged at predetermined intervals;
the housing is provided therein with support members for detachably supporting the trapping plates in place;
the housing has a trapping plate receiving part capable of receiving the trapping plates released from the support members and dropped down and of containing a liquid;
the chemical liquid supply means has a chemical liquid passage for supplying the chemical liquid so that the chemical liquid flows along the inner surface of the housing into the trapping plate receiving part; and
the trapping plates can be immersed in the chemical liquid contained in the trapping plate receiving part.

6. The trapping device according to claim 2 further comprising ultrasonic vibrators for applying vibrations to the trapping members while the chemical liquid is being supplied.

* * * * *